(12) United States Patent
Sicard

(10) Patent No.: US 9,720,030 B2
(45) Date of Patent: Aug. 1, 2017

(54) SYSTEMS AND METHODS FOR TESTING A CLAMP FUNCTION FOR INSULATED GATE BIPOLAR TRANSISTORS

(71) Applicant: FREESCALE SEMICONDUCTOR, INC., Austin, TX (US)

(72) Inventor: Thierry Sicard, Austin, TX (US)

(73) Assignee: NXP USA, Inc., Austin, TX (US)

( * ) Notice: Subject to any disclaimer, the term of this patent is extended or adjusted under 35 U.S.C. 154(b) by 45 days.

(21) Appl. No.: 14/733,589

(22) Filed: Jun. 8, 2015

(65) Prior Publication Data

US 2016/0356838 A1 Dec. 8, 2016

(51) Int. Cl.
*G01R 31/26* (2014.01)
*G01R 19/165* (2006.01)
*H03K 17/082* (2006.01)

(52) U.S. Cl.
CPC ... *G01R 31/2608* (2013.01); *G01R 19/16523* (2013.01); *H03K 17/0828* (2013.01)

(58) Field of Classification Search
CPC .................................................. G01R 31/2607
See application file for complete search history.

(56) References Cited

U.S. PATENT DOCUMENTS

| | | | | |
|---|---|---|---|---|
| 2006/0250742 A1* | 11/2006 | Fichera | ................ | H03K 17/122 361/100 |
| 2008/0212247 A1* | 9/2008 | Lee | .................. | H03K 17/08128 361/88 |
| 2013/0033909 A1* | 2/2013 | Jones | ................. | H03K 17/0812 363/56.01 |
| 2013/0293287 A1 | 11/2013 | Zhu | | |
| 2015/0280416 A1* | 10/2015 | Kreuter | ................. | H01H 83/00 361/55 |

FOREIGN PATENT DOCUMENTS

| | | |
|---|---|---|
| EP | 0190925 A2 | 2/1986 |
| EP | 0392530 A2 | 4/1990 |

\* cited by examiner

*Primary Examiner* — Clayton E Laballe
*Assistant Examiner* — Noam Reisner

(57) ABSTRACT

An integrated circuit includes an insulated gate bipolar transistor ("IGBT"), a clamp element coupled to a control gate of the IGBT to allow current flow in a first direction when voltage is applied to the control gate of the IGBT, and a blocking element coupled to the control gate of the IGBT and to the clamp element. The blocking element allows current flow in a second direction when voltage is removed from the control gate of the IGBT, the second direction is opposite the first direction. A resistive element has a first terminal and a second terminal, the first terminal is coupled between an anode of the clamping element and an anode of the blocking element and the second terminal is coupled to an output of test circuitry.

15 Claims, 3 Drawing Sheets

SYSTEMS AND METHODS FOR TESTING A CLAMP FUNCTION FOR INSULATED GATE BIPOLAR TRANSISTORS

BACKGROUND

Field

This disclosure relates generally to semiconductor devices, and more specifically, to test circuitry for insulated-gate bipolar transistors ("IGBT").

Related Art

Power devices are electronic components designed to be tolerant of the high currents and voltages that are present in power applications such as three-phase electric motors, automotive electronics, power supplies, telecommunications, and other applications that require devices to operate at currents in the range of tens up to hundreds of amperes (A).

Insulated-gate bipolar transistors ("IGBTs") are designed for power applications and combine metal-oxide-semiconductor ("MOS") gate control and a bipolar current flow mechanism. An IGBT incorporates features of both a metal-oxide-semiconductor field effect transistor ("MOSFET") and a bipolar junction transistor ("BJT"). IGBTs have higher current density than MOSFETs and faster switching characteristics than BJTs. IGBTs are a primary choice today for high-power (>10 kW), low to medium frequency (up to 30 kHz) applications.

Over current protection circuitry is often included in devices to protect IGBTs in over-current conditions. The protection circuitry allows for current clamping in order to protect the IGBT in over-current conditions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of circuit devices and methods disclosed herein include an over-current protection test system that injects a current at the common point of a clamp diode coupled to a control gate of an insulated gate bipolar transistor (IGBT). The current is used to check whether the current flows in one direction during power off and in another direction during power on. The circuit devices and methods can also detect whether the injection point is open before power off to indicate whether the clamp is connected between a driver circuit and the IGBT. Thus, given information about whether the clamp is properly connected can be used to avoid driving high current through a device when the protection circuitry is not properly connected.

Figure 1:
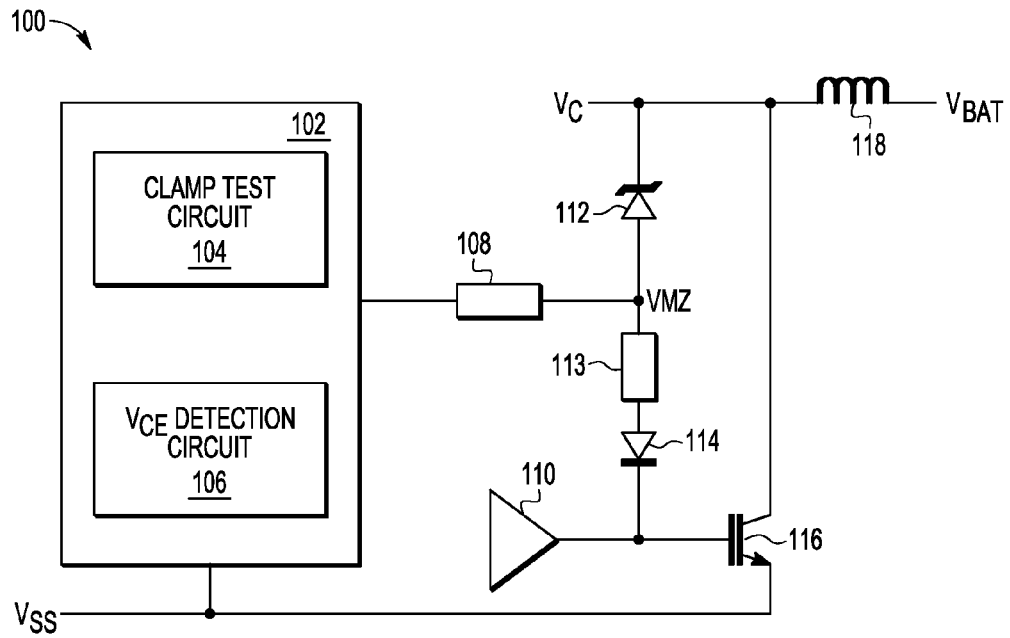
FIG. 1 illustrates an example block diagram of over-current protection test system for insulated-gate bipolar transistors (IGBT), in accordance with certain embodiments of the present disclosure.

FIG. 1 illustrates an example block diagram of over-current protection test system 100 for IGBT 116, in accordance with certain embodiments of the present disclosure. Test system 100 may include test circuitry 102 coupled to resistive element 108, which may then be coupled to an anode of Zener diode 112 and coupled to a control gate of IGBT 116 via resistive element 113, which is coupled to an anode of diode 114.

In some embodiments, IGBT 116 may have a first current (collector) electrode coupled to a voltage associated with an external source (e.g., VBAT associated with an external battery). In some configurations, inductive element 118 may be coupled between IGBT 116 and the voltage source. IGBT 116 may also have a second current (emitter) electrode coupled to a second voltage level (e.g., VSS). IGBT 116 may be driven by gate driver 110 coupled to a gate electrode of IGBT 116. Gate driver 110 may be any appropriate component or collection of components operable to drive IGBT 116, such as an operational amplifier.

In some embodiments, test system 100 may include clamp circuitry coupled to test circuitry 102 and IGBT 116. For example, clamping circuitry in test system 100 may include Zener diode 112 having a first terminal (cathode) coupled to a supply voltage VC that is provided by inductor 118 coupled to supply voltage VBAT. A second terminal (anode) of Zener diode 112 is coupled to a terminal of resistive element 108. The second terminal of Zener diode 112 may be coupled in series with resistive element 113 and/or diode 114. Diode 114 has a first terminal (anode) coupled to a terminal of resistive element 113 and a second terminal (cathode) coupled to a control electrode of IGBT 116. The clamping circuitry may act to protect IGBT 116 under certain over-current conditions.

In some embodiments, Zener diode 112 may have certain properties such that the offset voltage associated with Zener diode 112 in the clamping circuitry is lower than the breakdown voltage of IGBT 116. For example, if IGBT 116 is operable to handle 650V, Zener diode 112 may be selected to provide an offset voltage of lower than 650 V (e.g., 600V).

Resistive element 108 may be any appropriate resistive element (e.g., a resistor) with a relatively high resistance value such that a relatively large voltage drop may occur across resistive element 108. For example, resistive element 108 may be a 300 kΩ resistor or other suitable value.

Resistive element 113 may be any appropriate resistive element (e.g., a resistor) with a relatively low resistance value such that a relatively large voltage drop may occur with a relatively small current. For example, resistive element 113 may be a resistor with a value of 20-100Ω or other suitable value.

In some embodiments, test circuitry 102 may include clamp test circuit 104 and VCE detection circuit 106. As described in more detail below with reference to FIGS. 2-3, clamp test circuit 104 may be any appropriate components or collection of components operable to determine whether the clamping circuitry of test system 100 is operating correctly. For example, should an electrical connection between a terminal of Zener diode 112 and diode 114 be broken, clamp test circuit 104 will be operable to determine that the clamp is not working properly and provide a signal to test circuitry 102 that the clamping circuitry is not operational.

Figure 4:
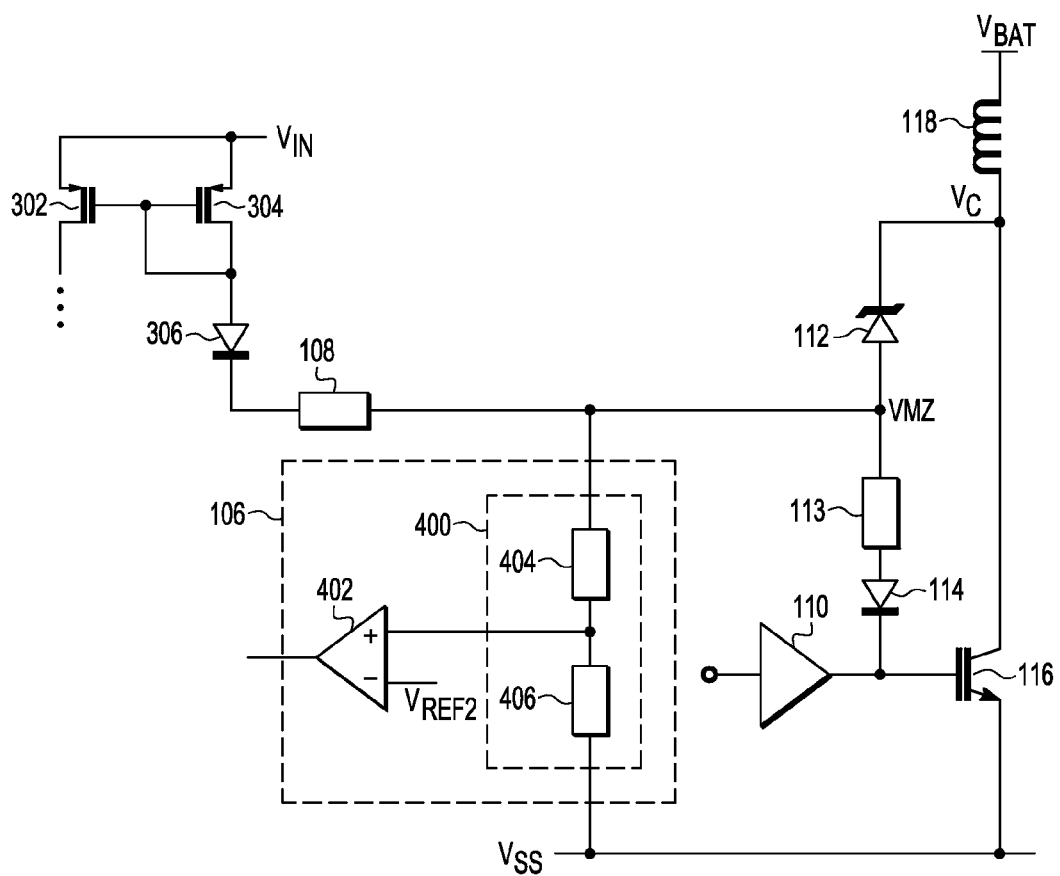
FIG. 4 illustrates block diagram of an embodiment of a VCE detection circuit that can be used in the test system of FIG. 1.

As described in more detail below with reference to FIGS. 4-5, VCE detection circuit 106 may be any appropriate component or collection of components operable to provide an indication that a voltage level across IGBT 116 is approaching a critical level such that the clamping circuitry may need to provide protection to IGBT 116. VCE detection circuit 106 may, in some embodiments, only provide such an indication when the voltage level is above a predetermined threshold. For example, clamping circuitry of test system 100 may be configured such that clamping is only operable when the voltage level is above a predetermined threshold, such as 600 V for example. VCE detection circuit 106 may be configured to provide a signal when the voltage level approaches 600 V and/or is above a warning threshold (e.g., 400 V), as described in more detail below with reference to FIGS. 4-5.

Figure 2:
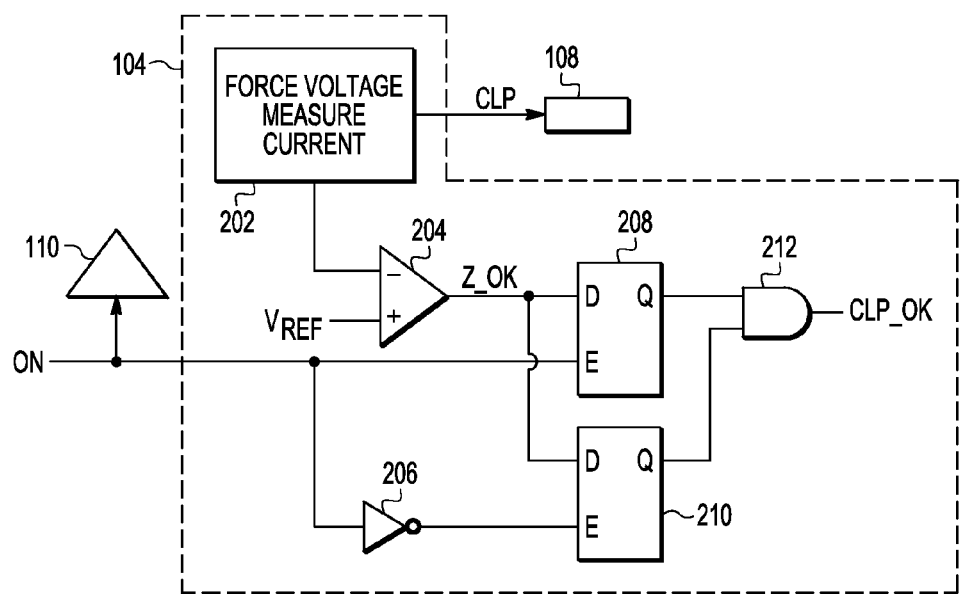
FIG. 2 illustrates a block diagram of an example of a clamp test circuit that can be used in the test system of FIG. 1.

Referring to FIGS. 1 and 2, FIG. 2 illustrates an example diagram of clamp test circuit 104, in accordance with certain embodiments of the present disclosure. In some embodiments, clamp test circuit 104 may include force-voltage/measure-current module 202 operable to apply a voltage to resistive element 108 of test system 100. Force-voltage/measure-current module 202 may also be operable to provide a voltage proportional to current through resistive element 108 to a negative input of comparator 204. A positive input to comparator 204 is coupled to a reference voltage. Comparator 204 provides an output that indicates whether current is flowing through resistive element 108, which indicates whether Zener diode 112 is coupled securely during a first operational stage, and whether diode 114 is coupled securely during a second operational stage. The output of comparator 204 is coupled to a data input of each of latch circuits 208, 210. An enable input to latch circuit 208 is coupled to an ON signal, which is set high when IGBT 116 is operating, and set low when IGBT 116 is not operating. The ON signal is also provided as an input to IGBT gate driver 110, as well as an input of inverter 206. An output of inverter 206 is coupled to an enable input of latch circuit 210. So, latch 208 is enabled when latch 210 is disabled, and vice versa.

An output of latch 208 is provided to a first input of AND gate 212 and an output of latch 210 is provided to a second input of AND gate 212. An output of AND gate 212 indicates whether the clamp circuitry is operating properly. In particular, the output of latch 208 indicates whether Zener diode 112 is connected properly when IGBT 116 transitions from on to off, and the output of latch 210 indicates when diode 114 is connected properly when IGBT 116 transitions from OFF to ON. If either Zener diode 112 or diode 114 are not properly connected, the output of AND gate 212 will indicate there is a problem with the clamp circuitry. A controller (not shown) monitoring and controlling the operation of IGBT 116 can use the indicator to avoid the possibility of subjecting IGBT 116 to over-current conditions if there is a problem with the clamp circuitry.

Figure 3:
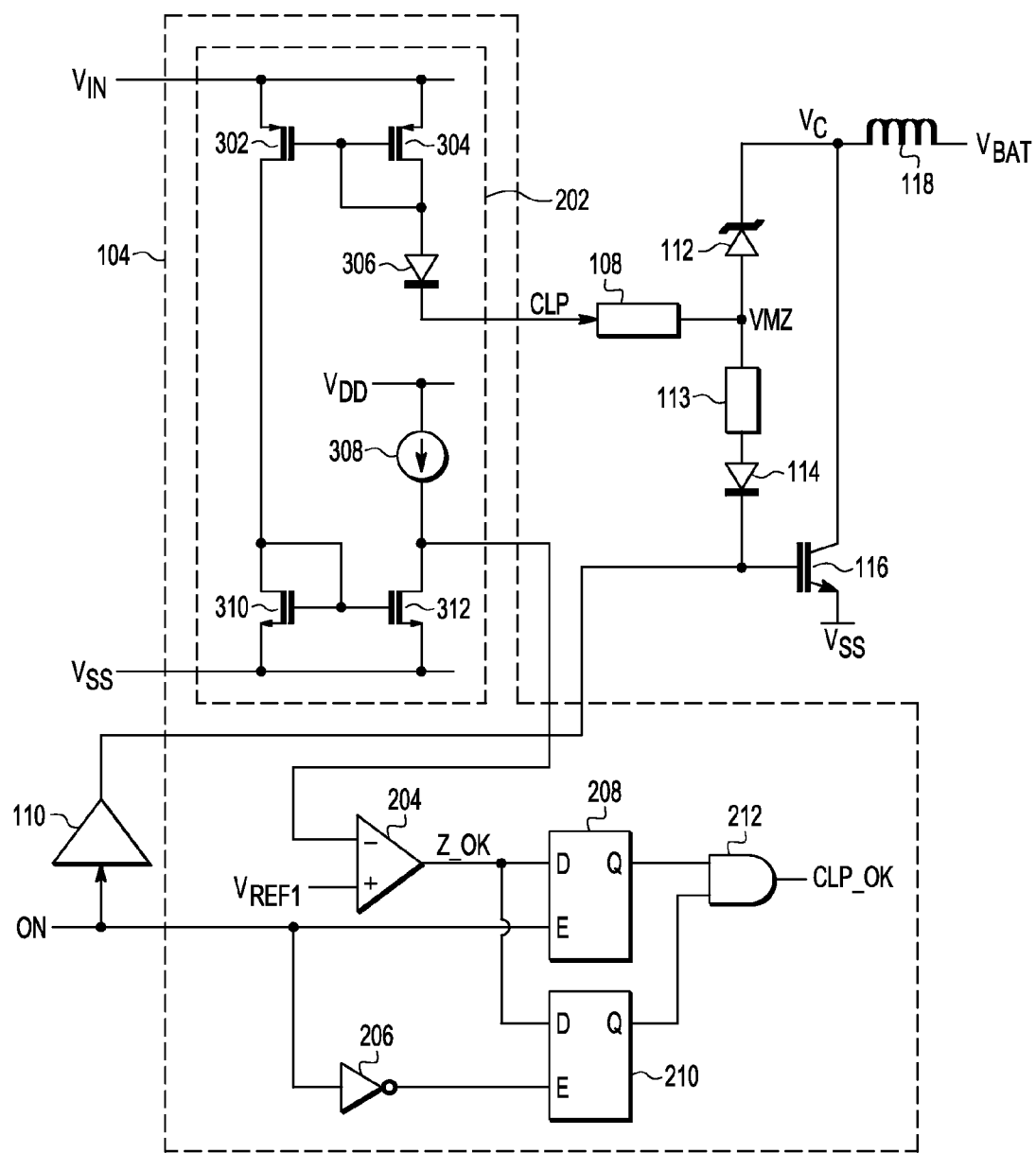
FIG. 3 illustrates an embodiment of a force-voltage/measure-current module that can be used in the clamp test circuit in the test system of FIG. 2.

FIG. 3 illustrates an embodiment of a force-voltage/measure-current (FVMC) module 202 that can be used in clamp test circuit 104 of FIGS. 1 and 2. FVMC module 202 includes a first current mirror with p-channel transistors 302 and 304, and a second current mirror with n-channel transistors 310, 312. Transistors 302, 304 have source electrodes coupled to a supply voltage VIN, for example, 10 Volts or other suitable voltage. A drain electrode of transistor 302 is coupled to a drain electrode of transistor 310. A gate electrode of transistor 302 is coupled to a gate electrode of transistor 304. A drain electrode of transistor 304 is coupled to the gate electrodes of transistors 302 and 304. The drain electrode of transistor 304 is also coupled to an anode of diode 306. A cathode of diode 306 is coupled to a terminal of resistive element 108. Another terminal of resistive element 108 is coupled to node VMZ.

The drain electrode of transistor 310 is coupled to gate electrodes of transistors 310 and 312. The gate electrodes of transistors 310 and 312 are also coupled to one another. A supply voltage VDD is coupled to an input of current source 308, and a drain electrode of transistor 312 is coupled to an output of current source 308 and to a negating input to comparator 204. Source electrodes of transistors 301 and 312 are coupled to supply voltage VSS, where VSS can be ground or other voltage lower in magnitude than supply voltage VDD.

During operation, source voltage VIN injects a current at node VMZ through resistive element 108. The current flowing in resistive element 108 is monitored by FVMC module 202 to determine whether clamp diodes 112, 114 are properly connected.

When IGBT 116 transitions from ON to OFF, voltage at the gate electrode of IGBT 116 is greater than the voltage at node VMZ, so current flows through Zener diode 112 but not through diode 114. Voltage at node VC at the output of inductor is low due to voltage VCE at the collector of IGBT 116 being saturated, resulting in a voltage at node VMZ that is lower than input voltage VIN. For example, voltage at the gate of IGBT 116 may be 15 Volts, input voltage VIN may be 10 Volts, voltage at node VMZ may be approximately 3 Volts. The value of logic power supply VDD at the input to current source 308 can be 2.5V, 3.3V, 5V or other suitable value depending on the technology node being used. The value of VREF at a non-negating input to comparator 204 can be placed at VDD/2 or other suitable value. Other suitable voltages can used. With voltage at node VMZ lower than 10 Volts, some current flows in resistive element 108 and through Zener diode 112, but not in diode 114. With current flowing through resistive element 108, the output of comparator 204 is HIGH and is stored in latch 208 each time the ON signal transitions from HIGH to LOW, or from ON to OFF. A HIGH value stored in latch 208 indicates Zener diode 112 is connected properly.

When IGBT 116 transitions from OFF to ON, voltage at the gate electrode of IGBT 116 is lower than the voltage at node VMZ, so current flows through diode 114 but not through Zener diode 112. Voltage at node VC at the output of inductor is high due to IGBT 116 being in non-conductive mode, resulting in a voltage at node VMZ that is higher than input voltage VIN. For example, voltage at the gate of IGBT 116 may be 0 Volts, input voltage VIN may be 10 Volts, voltage at node VMZ may be approximately 3 Volts. Other suitable voltages can used. With voltage at node VMZ lower than 10 Volts, some current flows in resistive element 108 and through diode 114, but not in Zener diode 112. With current flowing through resistive element 108, the output of comparator 204 is HIGH and is stored in latch 210 each time the ON signal transitions from LOW to HIGH, or from OFF to ON. A HIGH value stored in latch 210 indicates diode 114 is connected properly.

With knowledge of whether diodes 212, 214 are connected properly, the transition from ON to OFF and from OFF to ON can be made more gradually to avoid any overshoot of voltage across the collector and emitter of IGBT 116. VCE detection circuit 106 can be used to achieve better energy efficiency by driving higher current and transitioning from ON to OFF as quickly as possible while avoiding voltage overshoot. FIG. 4 illustrates a block diagram of an embodiment of VCE detection circuit 106 that can be used in the test system 100 of FIG. 1. In the embodiment of VCE detection circuit 106 show including voltage detector 400 including resistive elements 404 (R2) and 406 (R1), and comparator 402. A terminal of each of resistive elements 404, 406 is coupled with one another. Another terminal of resistive element 404 is coupled between a terminal of resistive element 108 and node VMZ. Another terminal of resistive element 406 is coupled to supply voltage VSS, or ground. A first input to comparator 402 is coupled between resistive elements 404 and 406. A second reference voltage VREF 2 is coupled to a second input of comparator 402. An output of comparator 402 indicates whether VCE is above or below a maximum threshold voltage, which in this case, would be VREF 2.

VCE detection circuit 106 detects the collector-emitter voltage VCE before VCE reaches a maximum value. This means that while the VCE is below the maximum threshold, the clamp circuit (diodes 112, 114) is not active and driver 110 is able to turn off IGBT 116 as fast as possible, because the maximum VCE has not been reached. When the maximum VCE threshold has been reached, the clamp circuit will operate to prevent over-voltage condition from damaging IGBT 116.

The anodes of Zener diode 112 and diode 114 are connected in series with resistive element 113 between them, providing a partially low impedance and a resistive clamp circuit. Connecting voltage detection circuit 106 to the anode of Zener diode 112 brings analog information to comparator 402, shifted by the voltage across Zener diode 112. Until the collector-emitter voltage reaches the voltage across Zener diode 112, feedback is not available, but between the maximum VCE threshold and the breakdown voltage of Zener diode 112, VCE detection circuit 106 provides a signal indicating whether collector-emitter voltage VCE of IGBT 116 is below or above the maximum threshold.

A maximum VCE threshold can be determined using the following formula:

$$VCEMAX=K*VREF2+VZ,$$

With $K=(R1+R2)/R1$, where VZ is the voltage across Zener diode 112, R1 is resistive element 404, R2 is resistive element 406, and R3 is resistive element 113.

In one example, resistive element 113 has a resistance value of 20 Ohms, resistive element 404 has a resistance value of 425 kOhms, resistive element 406 has a resistance value of 3 kOhms, VZ is 400 Volts, and VREF2 is 1.2 Volts resulting in a VCEMAX equal to 570 Volts. A VCE detection mode starts when IGBT 116 is strongly pulling down the gate to a negative voltage, such as −10 Volts, for example. As the pull-down capability of IGBT 116 is more than 30 Amps, the voltage across resistive element 113 is large enough to bring the Zener voltage VZ plus the voltage across resistive element 113 much higher than the VCE-MAX. In other words, the clamp circuit is not active.

When VCE becomes greater than VCEMAX, the output of comparator 402 goes high. This information can be stored and used to drive the current at the gate of IGBT 116 more slowly to avoid overshoot during the next power-on cycle. The limited current drive can be referred to as a VCE clamp mode for IGBT 116. Again referring to the values of resistive elements 113, 404, 406 and VREF2 in the foregoing example, the VCE clamp mode of detection circuit 106 starts when the IGBT gate current reaches 2 Amps, which forces a voltage across resistive element 113. The voltage across resistive element 406 plus Zener voltage VZ and IGBT gate voltage VG are used to determine the VCE clamp voltage using the following formula:

$$VCE\text{-}CLAMP=R3*IG+VZ+VG$$

where IG is the current at the gate of IGBT 116.

By using a resistive element in series with Zener diode 112 and changing the gate current, information regarding the maximum VCE threshold (VCEMAX) and VCE clamp voltage (VCE-CLAMP) to IGBT gate driver 110 is used to avoid overshoot and possible damage to IGBT 116.

By now it should be appreciated that in some embodiments, there has been provided an integrated circuit (100) that can comprise an insulated gate bipolar transistor ("IGBT") (116), a clamp element (112) coupled to a control gate of the IGBT to allow current flow in a first direction when voltage is applied to the control gate of the IGBT, a blocking element (114) coupled to the control gate of the IGBT and to the clamp element. The blocking element allows current flow in a second direction when voltage is removed from the control gate of the IGBT, the second direction is opposite the first direction. A resistive element (108) can have a first terminal and a second terminal, the first terminal is coupled between an anode of the clamping element (112) and an anode of the blocking element (114) and the second terminal is coupled to an output of test circuitry (102).

In another aspect, the clamp element can be a Zener diode having an anode and a cathode and the blocking element can be a blocking diode having an anode and a cathode. The cathode of the Zener diode is coupled to a voltage source, the anode of the Zener diode is coupled to the anode of the blocking diode, and the cathode of the blocking diode is coupled to the control gate of the IGBT.

In another aspect, when the integrated circuit transitions from on to off, the output of the test circuitry (102) is a voltage that is less than a voltage at the control gate of the IGBT to enable current to flow through the clamp element. When the integrated circuit transitions from off to on, the voltage output by the test circuitry is greater than the voltage at the control gate of the IGBT to enable current to flow through the blocking element.

In another aspect, the test circuitry can further comprise a clamp test circuit (104) including a comparator (204) having a first input coupled to a reference voltage (10V), a PMOS current mirror (302, 304) coupled to the output of the test circuitry (102), an NMOS current mirror (310, 312) having a first input coupled to the PMOS current mirror, a second input coupled to a current source (308), and an output coupled to a second input of the comparator. The comparator outputs a signal indicating current is flowing through the clamp element in the first direction.

In another aspect, the clamp test circuit (104) can further comprise a first flip-flop circuit (210) having a data input coupled to the signal output by the comparator, an enable input coupled to an inverted ON/OFF signal and an output indicating proper operation through the clamp element.

In another aspect, the clamp test circuit (104) can further comprise a second flip-flop circuit (208) having a data input coupled to the signal output by the comparator, an enable input coupled to a non-inverted ON/OFF signal and an output indicating proper operation through the blocking element.

In another aspect, the integrated circuit can further comprise a gate driver circuit (110) coupled to the control gate of the IGBT.

In another aspect, the integrated circuit can further comprise a logic gate (212) including a first input coupled to the output of the first flip-flop circuit (210), a second input coupled to the output of the second flip-flop circuit (208), and an output indicating proper operation of both the clamp element and the blocking element.

In another aspect, the maximum voltage of the clamping element is greater than the maximum collector-emitter voltage of the IGBT.

In another aspect, the integrated circuit can further comprise a collector-emitter voltage (VCE) detection circuit (106) including a voltage detector (400) coupled between an output of a PMOS current mirror (302, 304) and a supply voltage (VSS), a comparator (402) having a first input coupled to the voltage detector (400), a second input coupled to a reference voltage, and an output indicating whether the collector-emitter voltage is above the reference voltage.

In another aspect, the voltage detector can include a first resistive element (404) and a second resistive element (406) coupled in series, wherein a first terminal of the first resistive element is coupled to the output of the PMOS current mirror and a terminal of the second resistive element is coupled to the supply voltage.

In other embodiments, an integrated circuit (100) can comprise an insulated gate bipolar transistor ("IGBT") (116), a clamp element (112) coupled to a control gate of the IGBT to allow current flow in a first direction when voltage is applied to the control gate of the IGBT, and a blocking element (114) coupled to the control gate of the IGBT and to the clamp element. The blocking element allows current flow in a second direction when voltage is removed from the control gate of the IGBT. The second direction is opposite the first direction. A first resistive element (108) is coupled to a second resistive element. The second resistive element (113) can have a first terminal coupled to an anode of the clamp element and a cathode coupled to an anode of the blocking element. A clamp test circuit (104) can have an output coupled to a first terminal of the first resistive element (108). A second terminal of the first resistive element is coupled between the anode of the clamp element and the first terminal of the second resistive element. A collector-emitter voltage (VCE) detection circuit (106) can include an output coupled to the first terminal of the first resistive element. The output can indicate whether a collector-emitter voltage of the IGBT is greater than a specified value.

In another aspect, the cathode of the clamp element can be coupled to a collector of the IGBT and to a voltage source (118).

In another aspect, the clamp test circuit (104) can include a comparator (204) having a first input coupled to a reference voltage, a PMOS current mirror (302, 304) coupled to the output of the test circuitry (102), and an NMOS current mirror (310, 312) having a first input coupled to the PMOS current mirror, a second input coupled to a current source (308), and an output coupled to a second input of the comparator. The comparator can output a signal indicating current is flowing through the clamp element in the first direction.

In another aspect, the clamp test circuit (104) can further include a first flip-flop circuit (210) having a data input coupled to the signal output by the comparator, an enable input coupled to an inverted ON/OFF signal and an output indicating proper operation through the clamp element.

In another aspect, the clamp test circuit (104) can further include a second flip-flop circuit (208) having a data input coupled to the signal output by the comparator, an enable input coupled to a non-inverted ON/OFF signal and an output indicating proper operation through the blocking element.

In another aspect, the VCE detection circuit (106) can include a voltage detector (400) coupled between an output of a PMOS current mirror (302, 304) and a supply voltage (VSS), a comparator (402) having a first input coupled to the voltage detector (400), a second input coupled to a reference voltage, and the output indicating whether the collector-emitter voltage is greater than the specified value.

In another aspect, the voltage detector can include a first resistive element (404) and a second resistive element (406) coupled in series, wherein a first terminal of the first resistive element is coupled to the output of the PMOS current mirror and a terminal of the second resistive element is coupled to the supply voltage.

In still other embodiments, a method of testing a clamp circuit for an insulated gate bipolar transistor (IGBT) can comprise, when applying voltage to a control gate of the IGBT, determining that current flows through a resistive element to a clamping device and not a blocking device, wherein the clamping device and the blocking device are coupled to the control gate. When removing voltage from the control gate of the IGBT, determining that current flows through the resistive element to the blocking device and not the clamping device. The blocking device is coupled to the control gate, and an input to the clamping device is coupled to an input to the blocking device.

In another aspect, the method can further comprise detecting when a collector-emitter voltage (VCE) of the IGBT exceeds a maximum voltage including comparing an output from a VCE detection circuit (400) to a reference voltage. The VCE detection circuit can include a voltage detector (400) coupled between an output of a PMOS current mirror (302, 304) and a supply voltage (VSS), and a comparator (402) having a first input coupled to the voltage detector (400), a second input coupled to the reference voltage, and the output indicating when a collector-emitter voltage (VCE) of the IGBT exceeds a maximum voltage.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   an insulated gate bipolar transistor ("IGBT");
   a clamp element coupled to a control gate of the IGBT to allow current flow in a first direction when voltage is applied to the control gate of the IGBT;
   a blocking element coupled to the control gate of the IGBT and to the clamp element, the blocking element allows current flow in a second direction when voltage is removed from the control gate of the IGBT, the second direction is opposite the first direction;
   a resistive element having a first terminal and a second terminal, the first terminal is coupled between an anode of the clamping element and an anode of the blocking element and the second terminal is coupled to an output of test circuitry;
   a collector-emitter voltage (VCE) detection circuit including:
      a voltage detector coupled between an output of a PMOS current mirror and a supply voltage, the voltage detector including a first resistive element and a second resistive element coupled in series, wherein a first terminal of the first resistive element is coupled to the output of the PMOS current mirror and a terminal of the second resistive element is coupled to the supply voltage;
      a comparator having a first input coupled to the voltage detector, a second input coupled to a reference voltage, and an output indicating whether the collector-emitter voltage is above the reference voltage.

2. The integrated circuit of claim 1, wherein the clamp element is a Zener diode having an anode and a cathode and the blocking element is a blocking diode having an anode and a cathode, wherein the cathode of the Zener diode is coupled to a voltage source, the anode of the Zener diode is coupled to the anode of the blocking diode, and the cathode of the blocking diode is coupled to the control gate of the IGBT.

3. The integrated circuit of claim 1, wherein:
   when the integrated circuit transitions from on to off, the output of the test circuitry is a voltage that is less than a voltage at the control gate of the IGBT to enable current to flow through the clamp element; and
   when the integrated circuit transitions from off to on, the voltage output by the test circuitry is greater than the voltage at the control gate of the IGBT to enable current to flow through the blocking element.

4. The integrated circuit of claim 3, wherein the test circuitry further comprises:
   a clamp test circuit including:
      a comparator having a first input coupled to a reference voltage;
      a PMOS current mirror coupled to the output of the test circuitry;
      an NMOS current mirror having a first input coupled to the PMOS current mirror, a second input coupled to a current source, and an output coupled to a second input of the comparator;
      the comparator outputs a signal indicating current is flowing through the clamp element in the first direction.

5. The integrated circuit of claim 4, wherein the clamp test circuit further comprises:
   a first flip-flop circuit having a data input coupled to the signal output by the comparator, an enable input coupled to an inverted ON/OFF signal and an output indicating proper operation through the clamp element.

6. The integrated circuit of claim 5, wherein the clamp test circuit further comprises:
   a second flip-flop circuit having a data input coupled to the signal output by the comparator, an enable input coupled to a non-inverted ON/OFF signal and an output indicating proper operation through the blocking element.

7. The integrated circuit of claim 6, further comprising a gate driver circuit coupled to the control gate of the IGBT.

8. The integrated circuit of claim 6, further comprising a logic gate including a first input coupled to the output of the first flip-flop circuit, a second input coupled to the output of the second flip-flop circuit, and an output indicating proper operation of both the clamp element and the blocking element.

9. The integrated circuit of claim 6, wherein the maximum voltage of the clamping element is greater than the maximum collector-emitter voltage of the IGBT.

10. An integrated circuit comprising:
   an insulated gate bipolar transistor ("IGBT");
   a clamp element coupled to a control gate of the IGBT to allow current flow in a first direction when voltage is applied to the control gate of the IGBT;
   a blocking element coupled to the control gate of the IGBT and to the clamp element, the blocking element allows current flow in a second direction when voltage is removed from the control gate of the IGBT, the second direction is opposite the first direction;
   a first resistive element;
   a second resistive element having a first terminal coupled to an anode of the clamp element and a second terminal coupled to an anode of the blocking element;
   a clamp test circuit having an output coupled to a first terminal of the first resistive element, wherein a second terminal of the first resistive element is coupled between the anode of the clamp element and the first terminal of the second resistive element; and a collector-emitter voltage (VCE) detection circuit including an output coupled to the first terminal of the first resistive element, the output indicating whether a collector-emitter voltage of the IGBT is greater than a specified value, wherein the VCE detection circuit includes:

a voltage detector coupled between an output of a PMOS current mirror and a supply voltage, wherein the voltage detector includes a first resistive element and a second resistive element coupled in series, wherein a first terminal of the first resistive element is coupled to the output of the PMOS current mirror and a terminal of the second resistive element is coupled to the supply voltage;

a comparator having a first input coupled to the voltage detector, a second input coupled to a reference voltage, and the output indicating whether the collector-emitter voltage is greater than the specified value.

11. The integrated circuit of claim 10, wherein the cathode of the clamp element is coupled to a collector of the IGBT and to a voltage source.

12. The integrated circuit of claim 10, wherein the clamp test circuit includes:

a comparator having a first input coupled to a reference voltage;

a PMOS current mirror coupled to the output of the test circuitry;

an NMOS current mirror having a first input coupled to the PMOS current mirror, a second input coupled to a current source, and an output coupled to a second input of the comparator;

the comparator outputs a signal indicating current is flowing through the clamp element in the first direction.

13. The integrated circuit of claim 12, wherein the clamp test circuit further includes:

a first flip-flop circuit having a data input coupled to the signal output by the comparator, an enable input coupled to an inverted ON/OFF signal and an output indicating proper operation through the clamp element.

14. The integrated circuit of claim 13, wherein the clamp test circuit further includes:

a second flip-flop circuit having a data input coupled to the signal output by the comparator, an enable input coupled to a non-inverted ON/OFF signal and an output indicating proper operation through the blocking element.

15. A method of testing a clamp circuit for an insulated gate bipolar transistor (IGBT) comprising:

when applying voltage to a control gate of the IGBT, determining that current flows through a resistive element to a clamping device and not a blocking device, wherein the clamping device and the blocking device are coupled to the control gate;

when removing voltage from the control gate of the IGBT, determining that current flows through the resistive element to the blocking device and not the clamping device, wherein a cathode of the blocking device is coupled to the control gate, and an input to the clamping device is coupled to an input to the blocking device;

detecting when a collector-emitter voltage (VCE) of the IGBT exceeds a maximum voltage including comparing an output from a VCE detection circuit (400) to a reference voltage, wherein the VCE detection circuit includes a voltage detector coupled between an output of a PMOS current mirror and a supply voltage, the voltage detector includes a first resistive element and a second resistive element coupled in series, wherein a first terminal of the first resistive element is coupled to the output of the PMOS current mirror and a terminal of the second resistive element is coupled to the supply voltage; and a comparator having a first input coupled to the voltage detector, a second input coupled to the reference voltage, and the output indicating when the VCE of the IGBT exceeds a maximum voltage.

* * * * *